US008852854B2

(12) United States Patent
Wallow et al.

(10) Patent No.: US 8,852,854 B2
(45) Date of Patent: Oct. 7, 2014

(54) METHOD FOR FORMING A PHOTORESIST PATTERN ON A SEMICONDUCTOR WAFER USING OXIDATION-BASED CATALYSIS

(75) Inventors: Thomas Wallow, San Carlos, CA (US); Uzodinma Okoroanyanwu, Northampton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 723 days.

(21) Appl. No.: 11/709,721

(22) Filed: Feb. 21, 2007

(65) Prior Publication Data
US 2008/0199813 A1 Aug. 21, 2008

(51) Int. Cl.
*G03F 7/40* (2006.01)
*G03F 7/32* (2006.01)

(52) U.S. Cl.
CPC .................................. *G03F 7/32* (2013.01)
USPC ......................... 430/322; 430/325; 430/331

(58) Field of Classification Search
USPC ........................................ 430/322, 331, 325
See application file for complete search history.

(56) References Cited

U.S. PATENT DOCUMENTS

| | | | | |
|---|---|---|---|---|
| 3,607,272 A | * | 9/1971 | Rust | 430/292 |
| 3,711,287 A | * | 1/1973 | Dunham et al. | 430/196 |
| 4,423,138 A | * | 12/1983 | Guild | 430/326 |
| 6,686,123 B2 | * | 2/2004 | Lee et al. | 430/270.1 |
| 7,214,530 B2 | * | 5/2007 | Sayre et al. | 435/287.2 |
| 2003/0054292 A1 | * | 3/2003 | Choi et al. | 430/311 |
| 2007/0145549 A1 | * | 6/2007 | Barber | 257/678 |

OTHER PUBLICATIONS

Mike Nault, et al., "Single Layer Chemical Vapor Deposition Photoresist for 193 Nm Deep Ultraviolet Photolithography", 16(6) J. Vac. Sci. Technol., Nov./Dec. 1998, pp. 3730-3733.
Glenn Chapman, et al., "BiIn: a Sensitive Bimetallic Thermal Resist", 4345 Advances in Resist Technology and Processing XVIII, 2001, pp. 557-568.

* cited by examiner

*Primary Examiner* — Daborah Chacko Davis
(74) *Attorney, Agent, or Firm* — Farjami & Farjami LLP

(57) ABSTRACT

According to one exemplary embodiment, a method for forming a photoresist pattern on a semiconductor wafer includes forming a photoresist including an organic polymer matrix on the semiconductor wafer. The method further includes exposing the photoresist to a patterned radiation. The method further includes baking the photoresist after exposing the photoresist to the pattern radiation. The method further includes applying an oxidizing reagent to the photoresist to create the photoresist pattern corresponding to the patterned radiation.

11 Claims, 5 Drawing Sheets

METHOD FOR FORMING A PHOTORESIST PATTERN ON A SEMICONDUCTOR WAFER USING OXIDATION-BASED CATALYSIS

TECHNICAL FIELD

The present invention is generally in the field of semiconductor fabrication. More particularly, the invention is in the field of lithographic patterning of semiconductor wafers.

BACKGROUND ART

During semiconductor wafer fabrication, radiation, such as extreme ultraviolet (EUV) light or an electron beam, can be utilized in a lithographic process to form very small patterns, such as nanometer-scale patterns, on a semiconductor wafer. In EUV lithography, for example, a pattern formed on an EUV lithographic mask can be transferred to a semiconductor wafer by exposing a photoresist formed on the semiconductor wafer to EUV light reflected from the lithographic mask. However, to form an effective photoresist pattern using a low intensity radiation, such as EUV light, the sensitivity of the photoresist generally has to be increased.

In a conventional method, acid-based catalysis has been utilized in EUV lithography to increase the sensitivity of the photoresist to exposure to EUV light. However, inability to adequately control acid diffusion, as well as other problems, limits the effectiveness of acid-based catalysis in providing photoresist patterns having sufficient resolution and contrast, particularly for small pattern dimensions.

SUMMARY

A method for forming a photoresist pattern on a semiconductor wafer using oxidation-based catalysis, substantially as shown in and/or described in connection with at least one of the figures, as set forth more completely in the claims.

DETAILED DESCRIPTION OF THE INVENTION

The present invention is directed to a method for forming a photoresist pattern on a semiconductor wafer using oxidation-based catalysis. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
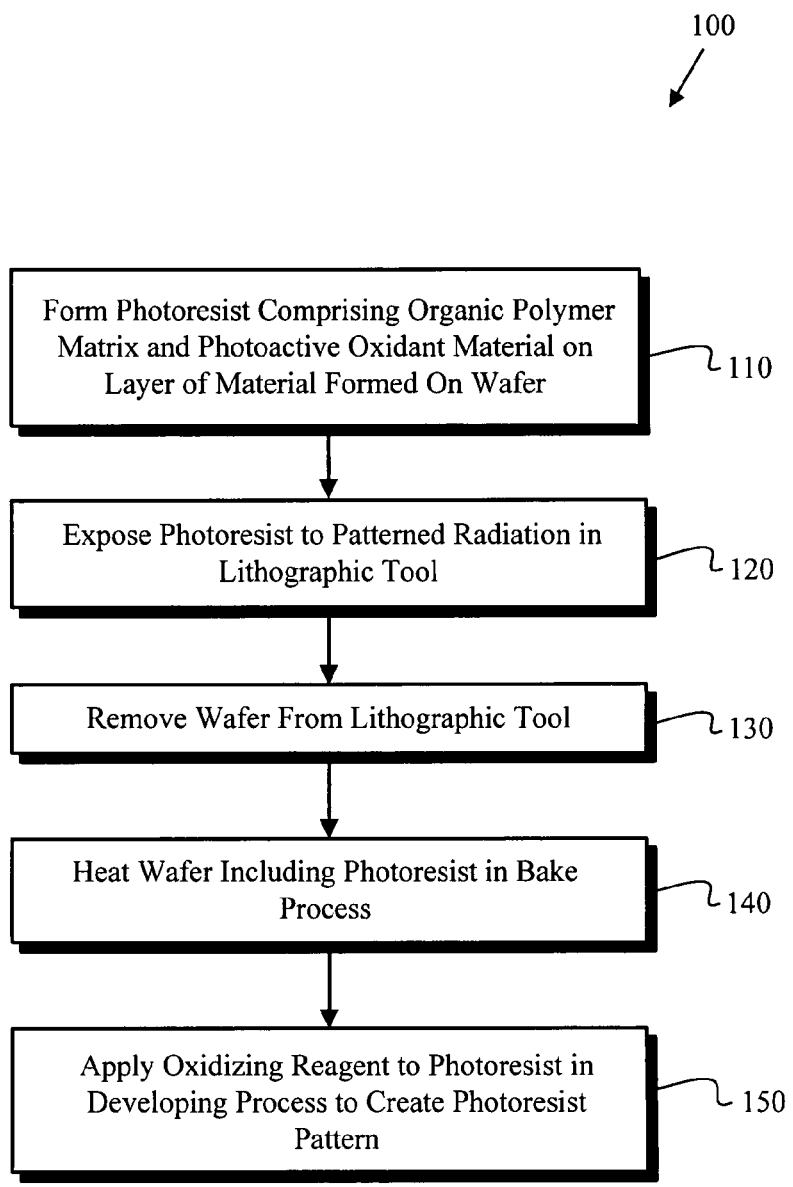
FIG. 1A shows a flowchart illustrating the steps taken to implement an embodiment of the present invention.

FIG. 1A shows a flowchart illustrating an exemplary method according to an embodiment of the present invention. Certain details and features have been left out of flowchart 100 that are apparent to a person of ordinary skill in the art. For example, a step may comprise one or more substeps or may involve specialized equipment or materials, as known in the art. While steps 110 through 150 indicated in flowchart 100 are sufficient to describe one embodiment of the present invention, other embodiments of the invention may utilize steps different from those shown in flowchart 100.

Figure 1B:
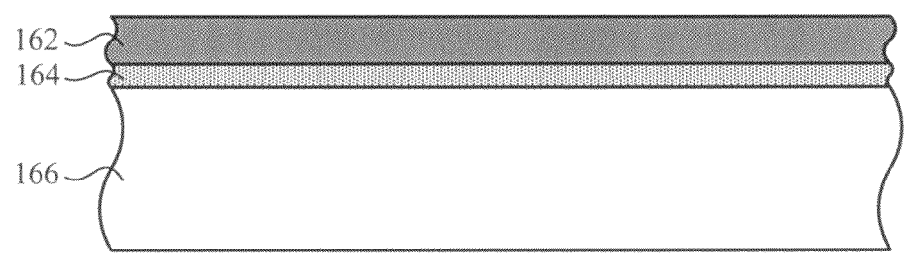
FIG. 1B illustrates a cross-sectional view, which includes a portion of a wafer processed according to an embodiment of the invention, corresponding to an initial step in the flowchart in FIG. 1A.

Referring now to step 110 of flowchart 100 in FIG. 1A, at step 110 of flowchart 100, a photoresist, such as photoresist 162 in FIG. 1B, comprising an organic polymer matrix and photoactive oxidant material is formed over a layer of material, such as layer 164, situated over a semiconductor wafer, such as wafer 166. The organic polymer matrix can comprise an organic polymer material comprising styrene or methoacrylate monomers, for example. The photoactive oxidant material can comprise one or more photoactive oxidant species, which can initiate oxidation of the organic polymer matrix in response to incident radiation, such as EUV (extreme ultraviolet) light. The photoresist can be formed over the layer of material by using a spin coat process or other suitable deposition process, for example. In another embodiment, the photoresist can comprise different materials. The layer of material can comprise a conductive material, such as polysilicon, aluminum, or copper, or a dielectric material, such as silicon dioxide or silicon nitride, for example. Referring to FIG. 1B, structure 160 illustrates the result of performing step 110 of flowchart 100, where photoresist 162 is formed over layer 164, which is situated over wafer 166.

At step 120 of flowchart 100, the photoresist is exposed to a patterned radiation in a lithographic process in a lithographic tool. During the lithographic process, the patterned radiation is utilized to transfer a pattern on a lithographic mask, such as an EUV lithographic mask, to the photoresist formed over the semiconductor wafer. The patterned radiation can comprise patterned EUV light, which includes low-intensity radiation provided by an EUV light source. In another embodiment, the patterned radiation can comprise a patterned electron beam, which includes low-intensity radiation provided by an electron beam. In the lithographic process, exposure to the patterned radiation activates the photoactive oxidant material, e.g., one or more photoactive oxidant species, in the photoresist so as to form a latent image corresponding to the pattern that is to be transferred to the photoresist from the lithographic mask. The latent image is formed on the photoresist as a result of an oxidation process that is initiated on exposed portions of the photoresist by an interaction between the patterned radiation and the photoactive oxidant material.

At step 130 of flowchart 100, the semiconductor wafer, which includes the photoresist, is removed from the lithographic tool for further processing. In the embodiment in FIG. 1A, a vacuum environment provided by the lithographic tool is not required to perform the remaining process steps of flowchart 100. For example, the remaining process steps of flowchart 100 can be performed in a non-vacuum environment, such as air. However, the remaining process steps of flowchart 100 may also be performed in nitrogen, oxygen, or other suitable type of environment, for example.

At step 140 of flowchart 100, the semiconductor wafer including the photoresist is heated in a bake process. In the embodiment in FIG. 1A, the semiconductor wafer can be baked at a sufficiently high temperature to accelerate catalytic chemical transformation of exposed areas of the photoresist by accelerating the oxidation process that was activated by exposure to the patterned radiation discussed above in step 120 of flowchart 100. In another embodiment, the semiconductor wafer may be heated in a process other than a bake process.

Figure 1C:
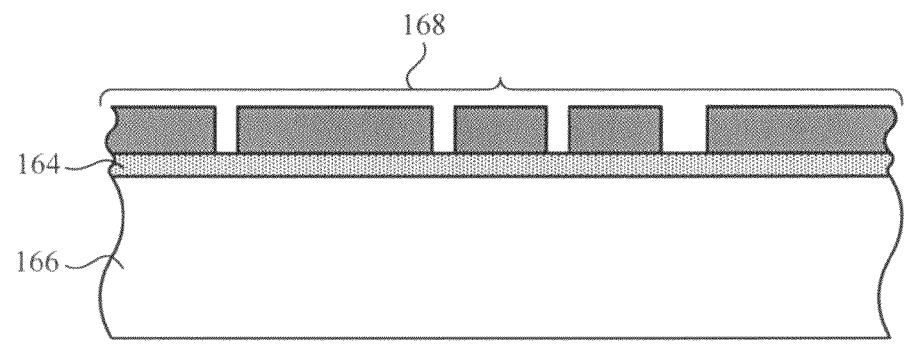
FIG. 1C illustrates a cross-sectional view, which includes a portion of a wafer processed according to an embodiment of the invention, corresponding to a final step in the flowchart in FIG. 1A.

At step 150 of flowchart 100, an oxidizing agent is applied to the photoresist in a developing process to create a photoresist pattern, such as photoresist pattern 168 in FIG. 1C, corresponding to the patterned radiation. In the developing process, the photoresist can be immersed in a solution in which the oxidizing reagent is dissolved, for example. The oxidizing reagent can comprise a perchlorate salt or a nitrate salt, for example. Application of the oxidizing reagent further drives the catalytic chemical transformation of the exposed photoresist that was activated in step 120 of flowchart 100 and accelerated in step 140. The oxidizing reagent effectively amplifies the effect of exposure of the photoresist to the patterned radiation, thus increasing the contrast between the exposed and unexposed areas of the photoresist. Referring to FIG. 1C, structure 170 illustrates the result of performing step 150 of flowchart 100, where photoresist pattern 168 is formed over layer 164, which is situated over wafer 166.

The photoresist pattern is created as a result of solubility changes associated with the chemical transformation occurring in the portions of the photoresist previously exposed to the patterned radiation in step 120 of flowchart 100. The change in solubility of the exposed photoresist, which was triggered by photoactivation of the oxidant species in the photoresist, is amplified by the oxidizing reagent through oxidation catalyzed chemical transformation events, thereby intensifying the contrast between exposed and unexposed areas of the photoresist. The resulting solubility differential between exposed and unexposed areas of the photoresist facilitates development of the photoresist pattern.

In EUV lithography, the radiation that is utilized to transfer a pattern on a lithographic mask to photoresist on a semiconductor wafer typically has a low intensity as a result of, for example, high absorbance of EUV radiation by most materials. As a result, amplification of the patterned radiation is necessary to achieve a desired photoresist pattern when a low intensity radiation, such as EUV radiation is utilized for pattern transfer. In the embodiment shown in flowchart 100 in FIG. 1A, the invention achieves significantly increased exposure sensitivity to low intensity radiation as the result of utilizing oxidation-based catalysis to provide a solubility differential between exposed and unexposed portions of the photoresist.

Thus, in the embodiment in FIG. 1A, the invention utilizes a photoresist comprising organic polymer matrix in combination with oxidation-based catalysis that is amplified by an oxidizing reagent to achieve a photoresist pattern having increased resolution and contrast in lithographic processes that rely on low intensity radiation, such as EUV or electron beam lithographic processes.

FIG. 1B shows a cross-sectional view of a structure including an exemplary photoresist after completion of step 110 of flowchart 100 in FIG. 1A. In FIG. 1B, structure 160 includes photoresist 162, layer 164, and semiconductor wafer substrate 166 (hereinafter referred to simply as "wafer 166"). As shown in FIG. 1B, layer 164 is situated over wafer 166 and photoresist 162 is situated over layer 164. Layer 164 can comprise a conductive material, such as polysilicon, aluminum, or copper, or a dielectric material, such as silicon dioxide or silicon nitride, for example. In the embodiment in FIGS. 1A and 1B, photoresist 162 can comprise an organic polymer matrix, which can comprise styrene or methoacrylate monomers, for example, and photoactive oxidant material.

FIG. 1C shows a cross-sectional view of a structure including an exemplary photoresist pattern after completion of step 150 of flowchart 100 in FIG. 1A. In FIG. 1C, structure 170 includes photoresist pattern 168, layer 164, and wafer 166. Structure 170 shows the result of performing steps 120, 130, 140, and 150 on structure 160 in FIG. 1B. As shown in FIG. 1C, photoresist pattern 168 is situated over layer 164, which is situated over wafer 166. Photoresist pattern 168 is formed as a result of forming and processing photoresist 162 by performing steps 110 through 150 in flowchart 100 in FIG. 1A.

Figure 2A:
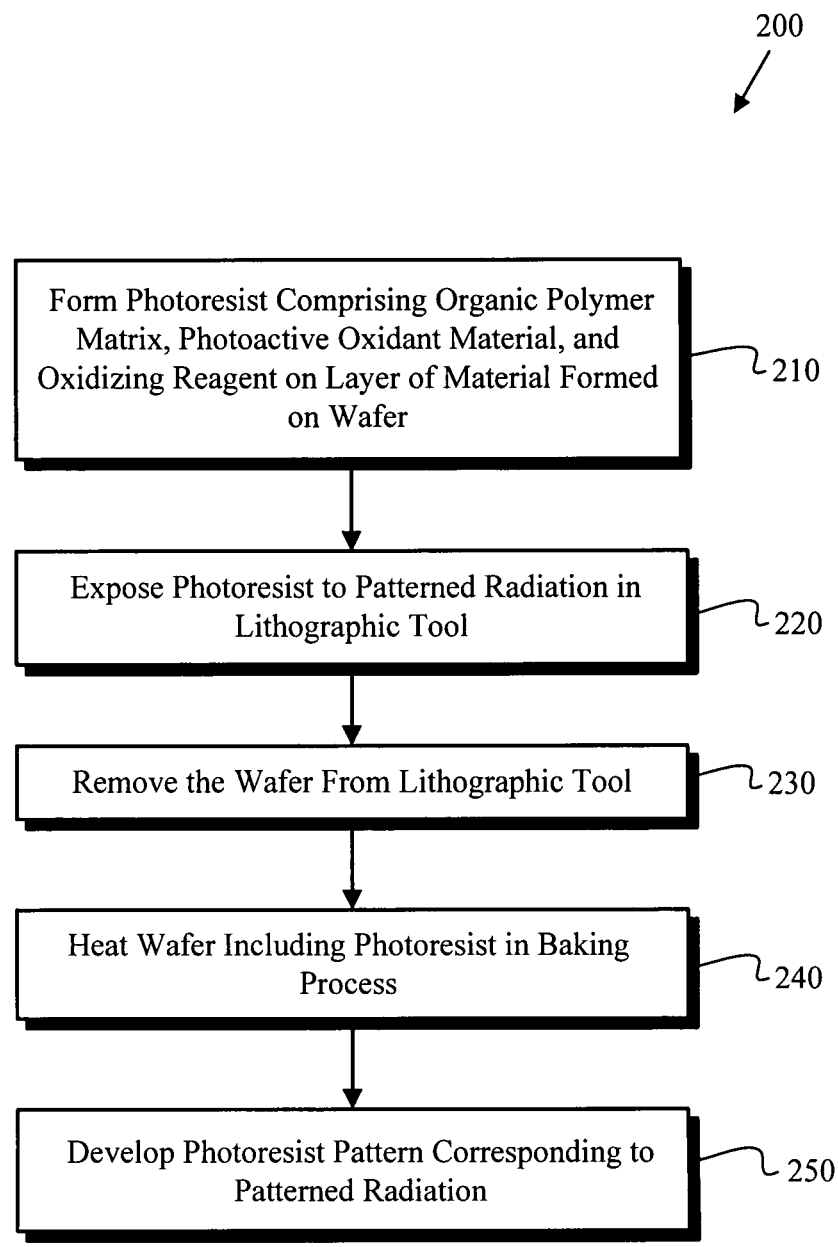
FIG. 2A shows a flowchart illustrating the steps taken to implement an embodiment of the present invention.

FIG. 2A shows a flowchart illustrating an exemplary method according to an embodiment of the present invention. Certain details and features have been left out of flowchart 200 that are apparent to a person of ordinary skill in the art. For example, a step may comprise one or more substeps or may involve specialized equipment or materials, as known in the art. While steps 210 through 250 indicated in flowchart 200 are sufficient to describe one embodiment of the present invention, other embodiments of the invention may utilize steps different from those shown in flowchart 200.

Figure 2B:
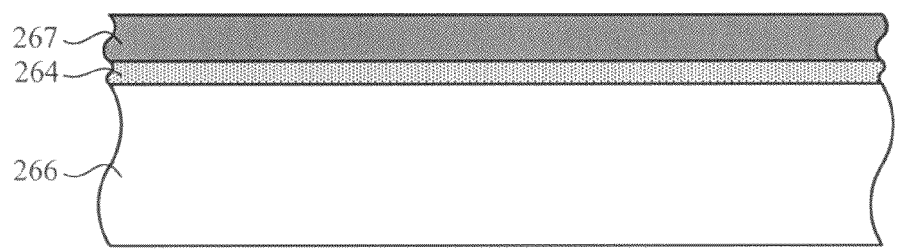
FIG. 2B illustrates a cross-sectional view, which includes a portion of a wafer processed according to an embodiment of the invention, corresponding to an initial step in the flowchart in FIG. 2A.

Referring to step 210 of flowchart 200 in FIG. 2A, at step 210 of flowchart 200, a photoresist, such as photoresist 267 in FIG. 2B, comprising an organic polymer matrix, photoactive oxidant material, and an oxidizing reagent is formed over a layer of material, such as layer 264, on a semiconductor wafer, such as wafer 266. The organic polymer matrix can comprise an organic polymer material comprising styrene or methoacrylate monomers, for example. The photoactive oxidant material can comprise one or more photoactive oxidant species, which can initiate oxidation of the organic polymer matrix in response to incident radiation, such as EUV (extreme ultraviolet) light. In the embodiment of the invention in FIG. 2A, the photoresist also includes an oxidizing reagent, which can comprise organic oxalate salt or organic peroxide, for example. Referring to FIG. 2B, structure 262 illustrates the result of performing step 210 of flowchart 200, where photoresist 267 is formed over layer 264, which is situated over wafer 266.

At step 220 of flowchart 200, the photoresist is exposed to a patterned radiation in a lithographic process in a lithographic tool. During the lithographic process, the patterned radiation is utilized to transfer a pattern on a lithographic mask, such as an EUV lithographic mask, to the photoresist formed over the semiconductor wafer. The patterned radiation can comprise patterned EUV light, which includes low-intensity radiation provided by an EUV light source. In another embodiment, the patterned radiation can comprise a patterned electron beam, which includes low-intensity radiation provided by an electron beam. In the lithographic process, exposure to the patterned radiation activates the photoactive oxidant material, e.g., one or more photoactive oxidant species, and the oxidizing reagent in the photoresist so as to form an image corresponding to the pattern that is to be transferred to the photoresist from the lithographic mask.

In the embodiment in FIG. 2A, the oxidizing reagent drives the oxidation process that is initiated on exposed portions of the photoresist by an interaction between the pattern radiation and the photoactive oxidant material, thereby amplifying the effect of exposure of the photoresist to the patterned radiation. As a result, the contrast between the exposed and unexposed portions of the photoresist is increased, thereby creating a photoresist pattern corresponding to the patterned radiation.

At step 230 of flowchart 100, the semiconductor wafer, which includes the photoresist, is removed from the lithographic tool for further processing. In the embodiment in FIG. 2A, a vacuum environment is not required to perform the remaining process steps of flowchart 200. For example, the remaining process steps of flowchart 200 can be performed in a non-vacuum environment, such as air. However, the remaining process steps of flowchart 200 may also be performed in nitrogen, oxygen, or other suitable type of environment, for example.

At step 240 of flowchart 200, the semiconductor wafer including the photoresist is heated in a bake process. In the embodiment in FIG. 2A, the semiconductor wafer can be baked at a sufficiently high temperature to accelerate the catalytic chemical transformation of exposed areas of the photoresist by accelerating the oxidation process that was initiated by the photoactive oxidant material as a result of exposure to the patterned radiation and further amplified by the oxidizing reagent as discussed above in step 220. In another embodiment, the semiconductor wafer may be heated in a process other than a bake process.

Figure 2C:
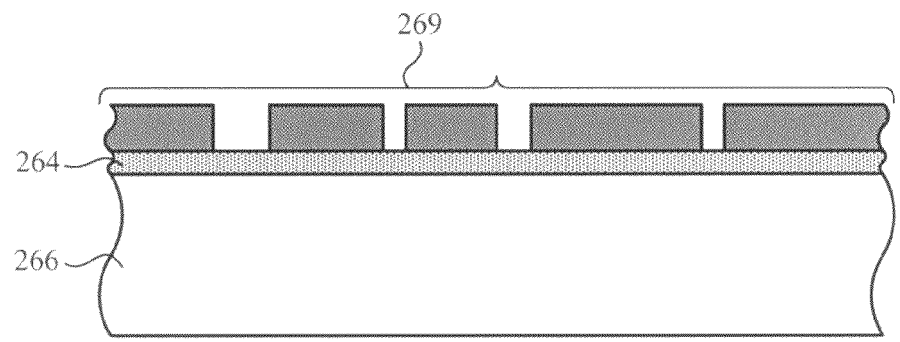
FIG. 2C illustrates a cross-sectional view, which includes a portion of a wafer processed according to an embodiment of the invention, corresponding to a final step in the flowchart in FIG. 2A.

At step 250 of flowchart 200, a photoresist pattern, such as photoresist pattern 269 in FIG. 2C, corresponding to the patterned radiation is developed by application of a developing reagent. The photoresist pattern can be developed by immersing the photoresist in a solution including a developing reagent that selectively dissolves the unexposed portions of the photoresist. In another embodiment, the photoresist pattern can be developed by immersing the photoresist in a solution including a developing reagent that selectively dissolves the exposed portions of the photoresist. Referring to FIG. 2C, structure 272 illustrates the result of performing step 250 of flowchart 200, where photoresist pattern 269 is formed over layer 264, which is situated over wafer 266.

In the embodiment in FIG. 2A, development of the photoresist pattern is enabled by a differential in solubility between exposed and unexposed portions of the photoresist that result from oxidation-based catalysis that was amplified by the oxidizing reagent in the photoresist and further accelerated in the bake process. Thus, in the embodiment in FIG. 2A, the invention utilizes a photoresist comprising organic polymer matrix and an oxidizing reagent for oxidation-based catalysis to advantageously achieve a photoresist pattern having increased resolution and contrast in a lithographic process utilizes low intensity radiation, such as an EUV or an electron beam lithographic process.

FIG. 2B shows a cross-sectional view of a structure including an exemplary photoresist after completion of step 210 of flowchart 200 in FIG. 2A. In FIG. 2B, structure 262 includes photoresist 267, layer 264, and semiconductor wafer substrate 266 (hereinafter referred to simply as "wafer 266"). In FIG. 2B, layer 264 and wafer 266 in structure 262 correspond, respectively, to layer 164 and wafer 166 in structure 160 in FIG. 1B. As shown in FIG. 2B, layer 264 is situated over wafer 266 and photoresist 267 is situated over layer 264. In the embodiment in FIGS. 2A and 2B, photoresist 267 can comprise an organic polymer matrix, which can comprise styrene or methoacrylate monomers, for example. Photoresist 267 can also comprise photoactive oxidant material and an oxidizing reagent, which can comprise an organic oxalate salt or organic peroxide, for example.

FIG. 2C shows a cross-sectional view of a structure including an exemplary photoresist pattern after completion of step 250 of flowchart 200 in FIG. 2A. In FIG. 2C, structure 272 includes photoresist pattern 268, layer 264, and wafer 266. Structure 272 shows the result of performing steps 220, 230, 240, and 250 on structure 262 in FIG. 2B. As shown in FIG. 2C, photoresist pattern 269 is situated over layer 264, which is situated over wafer 266. Photoresist pattern 269 is formed as a result of forming and processing photoresist 267 in FIG. 2B by performing steps 210 through 250 in flowchart 200 in FIG. 2A.

Figure 3:
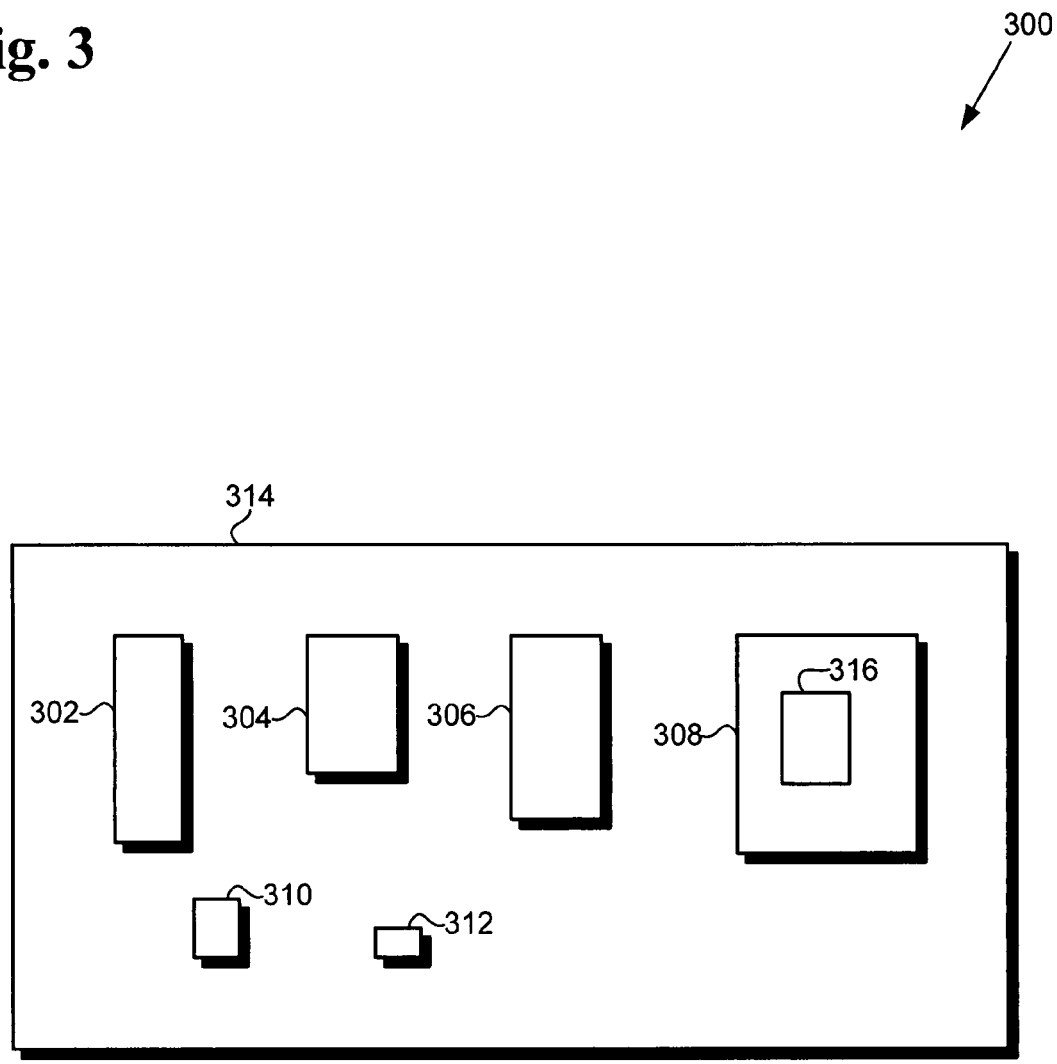
FIG. 3 illustrates a diagram of an exemplary electronic system including an exemplary IC chip or semiconductor die fabricated by utilizing a photoresist pattern formed in a lithographic process in accordance with one embodiment of the present invention.

FIG. 3 illustrates a diagram of an exemplary electronic system including an exemplary chip or die fabricated by utilizing an optical polarizer in a lithographic process in accordance with one embodiment of the present invention. Electronic system 300 includes exemplary modules 302, 304, and 306, IC chip 308 (also referred to as semiconductor die 308 in the present application), discrete components 310 and 312, residing in and interconnected through circuit board 314. In one embodiment, electronic system 300 may include more than one circuit board. IC chip 308 can comprise a semiconductor die that is fabricated by using an embodiment of the invention's method, such as the method illustrated in flowchart 100 in FIG. 1A or the method illustrated in flowchart 200 in FIG. 2A, to form a photoresist pattern in a lithographic process. IC chip 308 includes circuit 316, which can be a microprocessor, for example.

As shown in FIG. 3, modules 302, 304, and 306 are mounted on circuit board 314 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 314 can include a number of interconnect traces (not shown in FIG. 3) for interconnecting modules 302, 304, and 306, discrete components 310 and 312, and IC chip 308.

Also shown in FIG. 3, IC chip 308 is mounted on circuit board 314 and can comprise, for example, any semiconductor die that is fabricated by utilizing a photoresist pattern formed by an embodiment of the invention. In one embodiment, IC chip 308 may not be mounted on circuit board 314, and may be interconnected with other modules on different circuit boards. Further shown in FIG. 3, discrete components 310 and 312 are mounted on circuit board 314 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 300 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

As discussed above in the embodiments in FIGS. 1A and 2A, the invention provides a method for forming a photoresist pattern on a semiconductor wafer that utilizes oxidation-based catalysis to amplify the effect on a photoresist to exposure to low intensity radiation in a lithographic process. By utilizing oxidation-based catalysis to amplify the effect of low intensity radiation on a photoresist, the invention's method significantly increases the photoresist's sensitivity to low intensity radiation, thereby advantageously increasing resolution and contrast of a photoresist pattern formed by using EUV or electron beam lithography in semiconductor wafer fabrication. It is understood to those of ordinary skill in the art that although the invention has been described in reference to a "wafer," such wafer can be diced and singulated into individual dies and thereafter packaged using various semiconductor packaging techniques and processes. As such, the invention is manifestly applicable to fabricating wafers and/or dies, which may or may not be later packaged, in accordance with the teachings of the invention as described above.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for forming a photoresist pattern on a semiconductor wafer using oxidation-based catalysis has been described.

The invention claimed is:

1. A method for forming a photoresist pattern on a semiconductor wafer, said method comprising:
    forming a photoresist comprising an organic polymer matrix and a photoactive oxidant material on said semiconductor wafer;
    exposing portions of said photoresist to a patterned radiation such that said photoactive oxidant material initiates an oxidation process of said organic polymer matrix, said oxidation process changing solubility of said portions of said photoresist;
    applying an oxidizing reagent comprising a perchlorate salt to said photoresist which drives said oxidation process to create said photoresist pattern.

2. The method of claim 1 further comprising utilizing said photoresist pattern to fabricate a semiconductor die on said semiconductor wafer.

3. The method of claim 2 further comprising incorporating said semiconductor die in a circuit board.

4. The method of claim 1 further comprising a step of baking said photoresist after said step of exposing said photoresist to said patterned radiation.

5. The method of claim 1, wherein said organic polymer matrix is formed from materials selected from the group consisting of styrene monomers and methoacrylate monomers.

6. The method of claim 1, wherein said patterned radiation is selected from the group consisting of a patterned EUV light and a patterned electron beam.

7. A method for forming a photoresist pattern on a semiconductor wafer, said method comprising:
    forming a photoresist comprising an organic polymer matrix, a photoactive oxidant material, and an oxidizing reagent comprising an organic oxalate salt on said semiconductor wafer;
    exposing portions of said photoresist to a patterned radiation, thereby activating said photoactive oxidant to initiate an oxidation process of said organic polymer matrix and activating said oxidizing reagent which drives said oxidation process to create said photoresist pattern, said photoresist pattern being defined by removal of said portions of said photoresist.

8. The method of claim 5 further comprising a step of baking said photoresist.

9. The method of claim 8 further comprising a step of developing said photoresist pattern.

10. The method of claim 5, wherein said organic polymer matrix is formed from materials selected from the group consisting of styrene monomers and methoacrylate monomers.

11. The method of claim 5, wherein said patterned radiation is selected from the group consisting of a patterned EUV light and a patterned electron beam.

* * * * *